United States Patent
Liu et al.

(10) Patent No.: US 9,431,540 B2
(45) Date of Patent: Aug. 30, 2016

(54) METHOD FOR MAKING A SEMICONDUCTOR DEVICE WITH SIDEWALL SPACERS FOR CONFINING EPITAXIAL GROWTH

(71) Applicants: STMICROELECTRONICS, INC., Coppell, TX (US); GLOBALFOUNDRIES Inc., Grand Cayman (KY); INTERNATIONAL BUSINESS MACHINES CORPORATION, Armonk, NY (US)

(72) Inventors: Qing Liu, Watervliet, NY (US); Ruilong Xie, Schenectady, NY (US); Xiuyu Cai, Niskayuna, NY (US); Chun-chen Yeh, Clifton Park, NY (US)

(73) Assignees: STMICROELECTRONICS, INC., Coppell, TX (US); GLOBALFOUNDRIES Inc., Grand Cayman (KY); INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/288,766

(22) Filed: May 28, 2014

(65) Prior Publication Data

US 2015/0349085 A1    Dec. 3, 2015

(51) Int. Cl.
*H01L 29/66* (2006.01)
*H01L 29/165* (2006.01)
*H01L 29/78* (2006.01)

(52) U.S. Cl.
CPC ....... *H01L 29/785* (2013.01); *H01L 29/66795* (2013.01); *H01L 29/165* (2013.01)

(58) Field of Classification Search
None
See application file for complete search history.

(56) References Cited

U.S. PATENT DOCUMENTS

2011/0147842 A1\* 6/2011 Cappellani ........ H01L 21/26506
257/365

\* cited by examiner

*Primary Examiner* — Alexander Ghyka
(74) *Attorney, Agent, or Firm* — Seed IP Law Group PLLC

(57) ABSTRACT

A method for making a semiconductor device includes forming laterally spaced-apart semiconductor fins above a substrate. At least one dielectric layer is formed adjacent an end portion of the semiconductor fins and within the space between adjacent semiconductor fins. A pair of sidewall spacers is formed adjacent outermost semiconductor fins at the end portion of the semiconductor fins. The at least one dielectric layer and end portion of the semiconductor fins between the pair of sidewall spacers are removed. Source/drain regions are formed between the pair of sidewall spacers.

21 Claims, 6 Drawing Sheets

METHOD FOR MAKING A SEMICONDUCTOR DEVICE WITH SIDEWALL SPACERS FOR CONFINING EPITAXIAL GROWTH

FIELD OF THE INVENTION

The present invention relates to the field of electronic devices and, more particularly, to semiconductor devices and related methods.

BACKGROUND OF THE INVENTION

Fin-based field effect transistors (FINFETs) are vertical transistor devices in which a semiconductor fin is located on a substrate and is used to define the source, drain, and channel regions of the device. A gate structure overlies the fin in the channel area, and in some configurations multiple fins may be used to provide a multi-gate transistor architecture. The multiple gates may be controlled by a single gate electrode, where the multiple gate surfaces act electrically as a single gate, or by independent gate electrodes.

FINFET devices may provide desired short channel control to enable technology scaling down to 10 nm nodes and beyond. With ever-increasing device integration densities, various challenges may arise with respect to FINFET semiconductor devices. For example, with increasing densities, the distances between adjacent devices become smaller, making the chances for inadvertent shorting between them greater.

A source/drain in-situ doped epitaxial merge process may be used to connect the fins outside of the gate for lowering the source/drain spreading resistance, and to provide a relatively flat topography for source/drain contact landings. One potential drawback of this lateral epitaxial growth in complementary devices is that in the boundary region between N-type and P-type transistors, relaxed or wider spacing may otherwise be required to keep epitaxial growth from shorting together the fins from the N-type and P-type transistors.

More particularly, due to the loading effects, the fins tend to experience more epitaxial growth, which may make it challenging to achieve desired growth in the source/drain regions without inter-fin growth that results in shorting. However, increasing the spacing between N-type and P-type devices reduces the amount of available surface area, and accordingly, restricts chip area scaling, especially in ultra-dense SRAM arrays, for example.

SUMMARY OF THE INVENTION

A method for making a semiconductor device includes forming, above a substrate, a plurality of laterally spaced-apart semiconductor fins, and forming at least one dielectric layer adjacent an end portion of the plurality of semiconductor fins and within the space between adjacent semiconductor fins. A pair of sidewall spacers may be formed adjacent outermost semiconductor fins at the end portion of the plurality of semiconductor fins. The method may further include removing the at least one dielectric layer and end portion of the plurality of semiconductor fins between the pair of sidewall spacers, and forming source/drain regions between the pair of sidewall spacers.

The source/drain regions may be epitaxially grown. In particular, the source/drain regions may comprise epitaxially grown silicon or silicon germanium, for example. The sidewall spacers advantageously confine lateral epitaxial growth of the source/drain regions. As a result, a thickness of the lateral epitaxial growth may be uniform which helps to reduce performance variations within semiconductor devices. Without confinement, this lateral epitaxial growth in the boundary region between N-type and P-type transistors in complementary devices, for example, may short together the semiconductor fins from the N-type and P-type transistors.

Forming the at least one dielectric layer may comprise forming a first dielectric layer comprising a first dielectric material on the end portion of the plurality of semiconductor fins, and forming a second dielectric layer comprising a second dielectric material different than the first dielectric material on the first dielectric layer and with the second dielectric material filling the space between adjacent semiconductor fins. Forming the second dielectric layer may comprise atomic layer deposition thereof.

The method may further comprise, before forming the sidewall spacers, removing portions of the second dielectric layer laterally adjacent the outermost semiconductor fins and above the semiconductor fins while retaining portions of the second dielectric layer filling the space between adjacent semiconductor fins.

The method may further comprise forming a gate overlying the semiconductor fins. The semiconductor fins may comprise silicon, and the substrate may comprise a semiconductor substrate.

A related semiconductor device may comprise a substrate, a plurality of laterally spaced-apart semiconductor fins above the substrate, and sidewall spacers aligned with outermost semiconductor fins at an end of the plurality of semiconductor fins. Source/drain regions may be between the sidewall spacers.

DETAILED DESCRIPTION OF THE PREFERRED EMBODIMENTS

Figure 1:
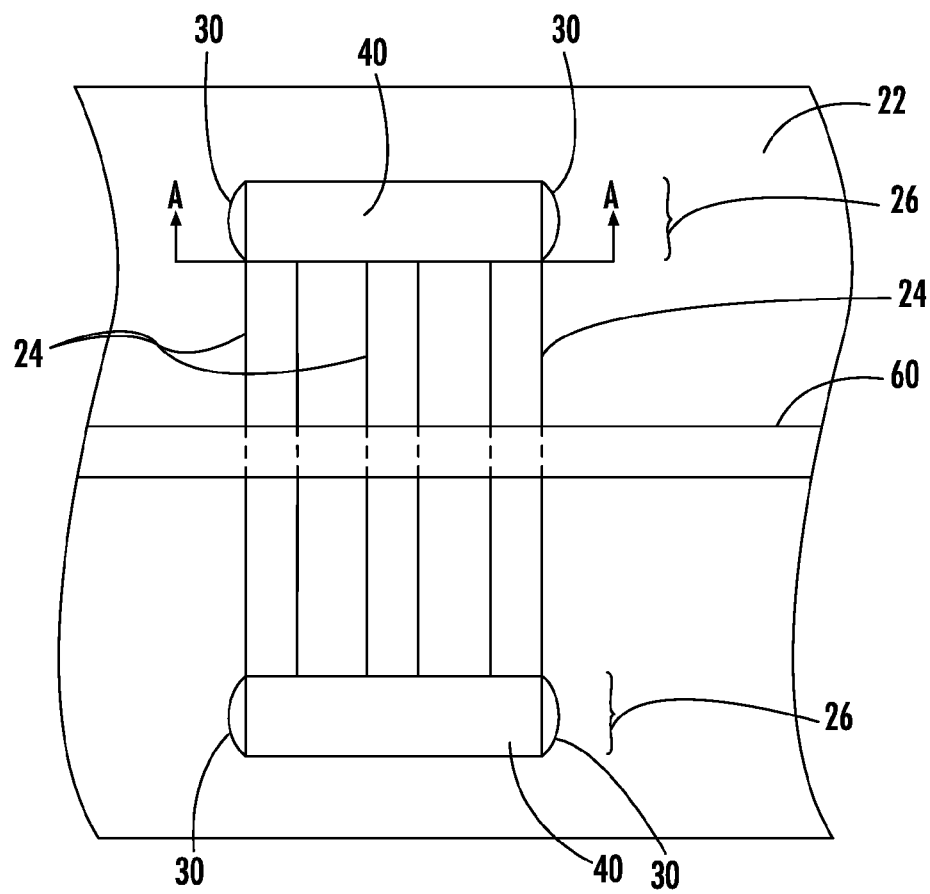
FIG. 1 is a top view of a semiconductor FINFET device with sidewall spacers to confine epitaxial growth within the source/drain regions.
Figure 2:
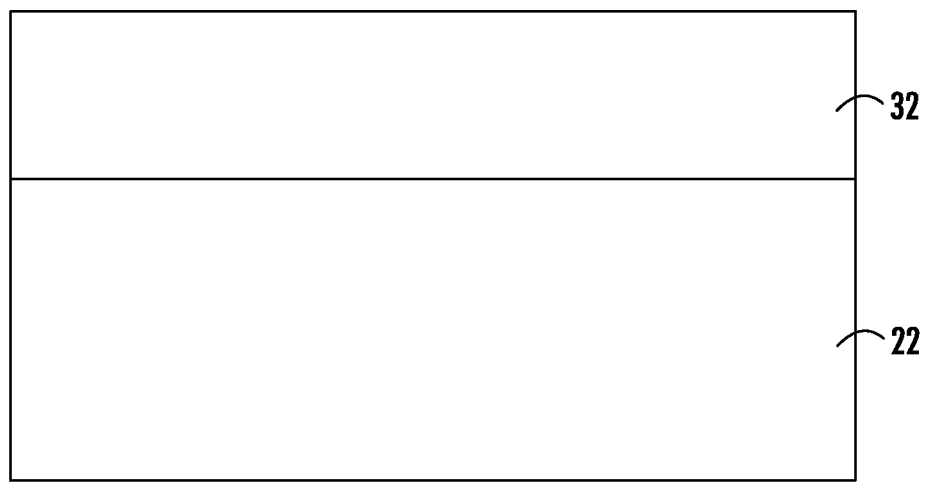
FIGS. 2-9 are a series of cross-sectional views taken along line A-A of FIG. 1 and illustrating a method of making the semiconductor FINFET device shown therein.
Figure 3:
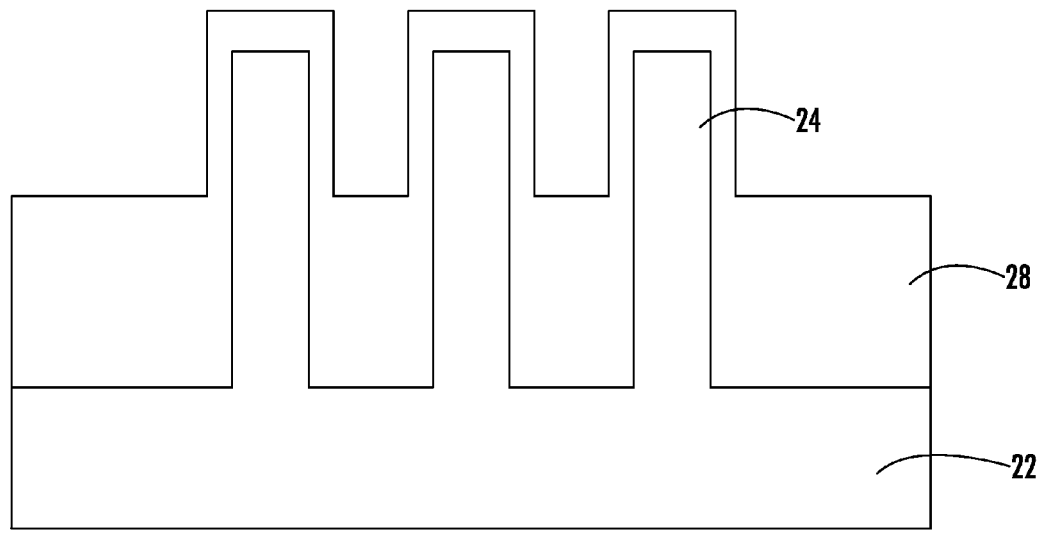

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Referring now to FIGS. 1-9, a semiconductor FINFET device 20 with sidewall spacers 30 to confine epitaxial growth within the source/drain regions 40 and associated method for making the semiconductor device are described. As provided in FIG. 1, semiconductor fins 24 extend between the source/drain regions 40 above a substrate 22, and a gate 60 overlies the semiconductor fins 24, with the gate being perpendicular to a length of the semiconductor fins. The region of the semiconductor fins 24 that are positioned below the gate 60 defines a semiconductor channel region.

As will be described in greater detail below, the source/drain regions 40 are epitaxially grown, and the sidewall spacers 30 advantageously confine lateral epitaxial growth of the source/drain regions. Confinement of this lateral epitaxial growth in the boundary region between N-type and P-type transistors in complementary devices helps to prevent a short between the semiconductor fins from the N-type and P-type transistors.

The cross-sectional side views in FIGS. 2-9 are taken along line AA' in FIG. 1. On the substrate 22 (e.g., silicon), a hard mask 60 (e.g., silicon nitride, SiN) is initially formed, as provided in FIG. 2. A fin patterning/etching step may then be performed, as provided in FIG. 3, to define a plurality of laterally spaced-apart semiconductor fins 24, as will be appreciated by those skilled in the art. The semiconductor fins 24 include opposing end portions 26. A first dielectric layer 28, such as silicon oxide, may then be formed on the semiconductor fins 24, and on the semiconductor substrate 22 between the semiconductor fins and outside of the semiconductor fins adjacent the outermost semiconductor fins.

Figure 4:
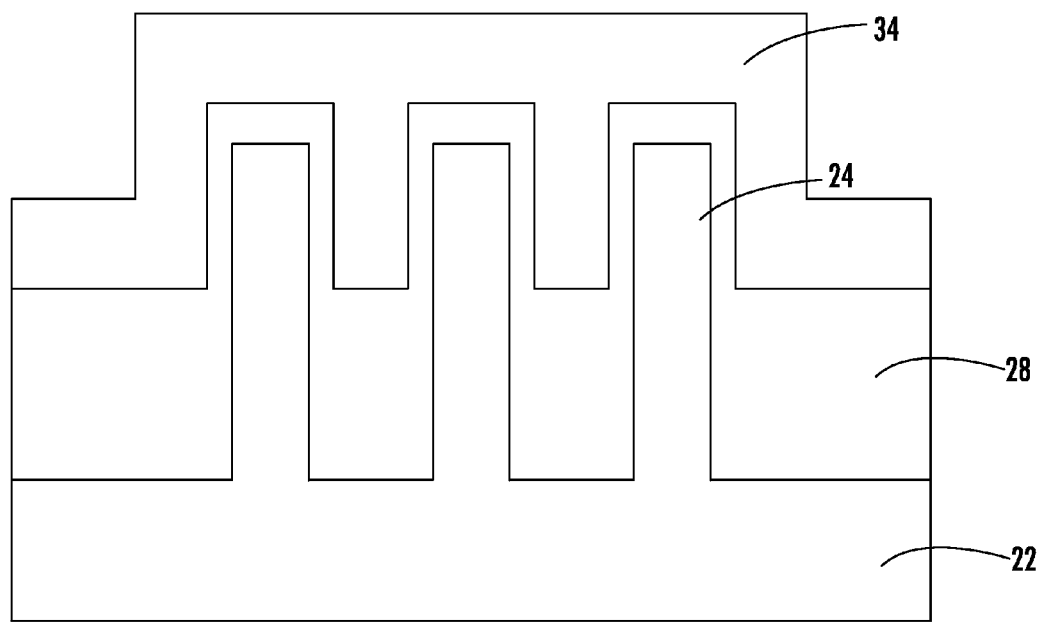

A second dielectric layer 34 is formed on the substrate 22 between semiconductor fins 24 at the opposing ends 26 of the semiconductor fins, as provided in FIG. 4. More particularly, the protective dielectric layer 34 is also formed on the substrate 22 adjacent the outermost semiconductor fins 24 and on the semiconductor fins 24 at the opposing end portions 26 of the semiconductor fins. Atomic layer deposition may be used to deposit the second dielectric layer 34. As readily appreciated by those skilled in the art, atomic layer deposition of the second dielectric layer 34 continues until pinch-off occurs between the semiconductor fins 24.

The second dielectric layer 34 may comprise aluminum oxide. Other suitable materials may also be used for the second dielectric layer 34, as will be appreciated by those skilled in the art. For example, such materials may include oxides which are different than the silicon oxide 28, as this will allow selective removal of the second dielectric layer 34, as will be discussed further below.

Figure 5:
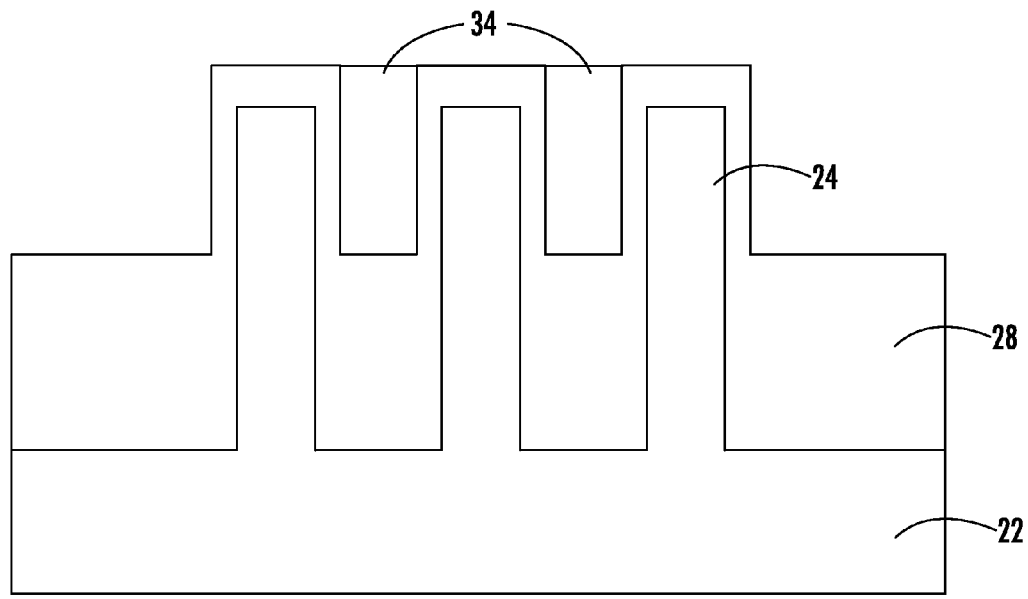

The second dielectric layer 34 may then be selectively removed from the substrate 22 adjacent the outermost semiconductor fins 24, and removed from an upper surface of the semiconductor fins 24, as provided in FIG. 5. In other words, the second dielectric layer 34 is isotropically etched so that the second dielectric layer 34 remains between the semiconductor fins 24. An upper surface of the second dielectric layer 34 is coplanar with an upper surface of the semiconductor fins 24. The first dielectric layer 28 remains in place since this layer comprises a dielectric that is different from the dielectric in the second dielectric layer 34.

Figure 6:
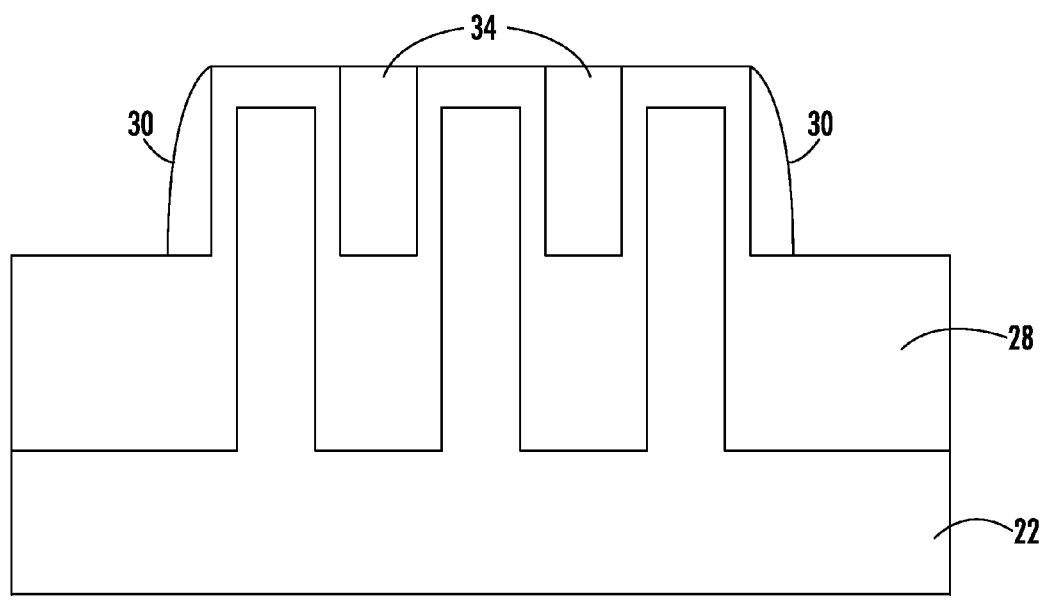
Figure 7:
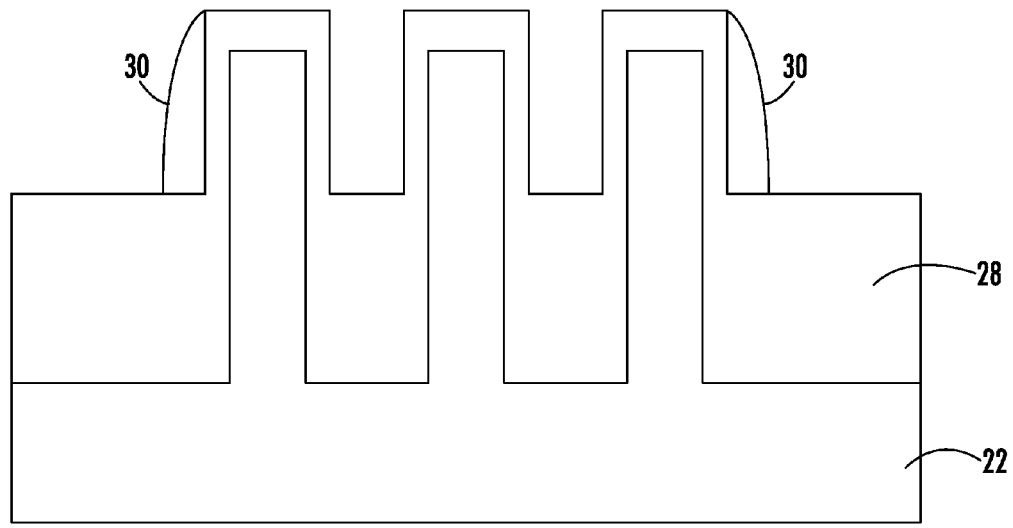
Figure 8:
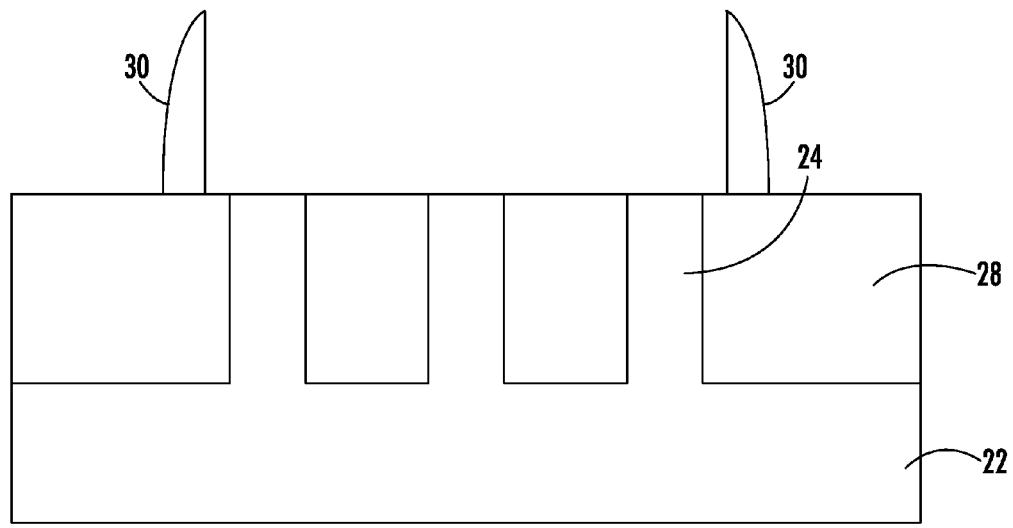

Sidewall spacers 30 are formed on outermost semiconductor fins at the opposing end portions 26 of the semiconductor fins 24, as provided in FIG. 6. The sidewall spacers 30 are silicon nitride, for example. The second dielectric layer 34 between the semiconductor fins 24 at the opposing end portions 26 of the semiconductor fins is removed, as provided in FIG. 7. Afterwards, the semiconductor fins 24 between the sidewall spacers 30 are removed, as provided in FIG. 8.

Figure 9:
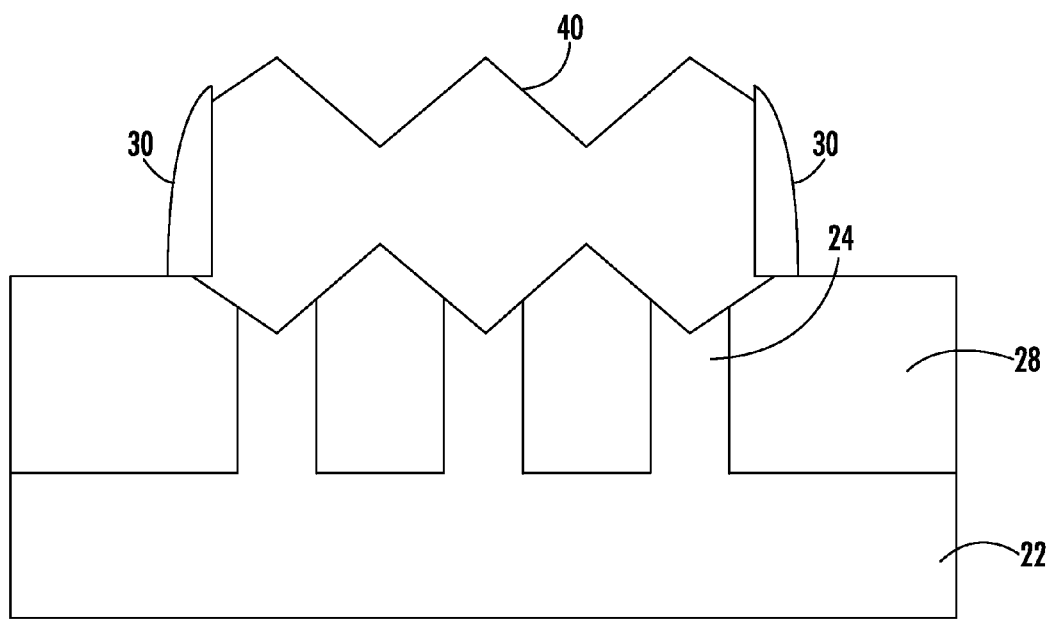

A selective epitaxial growth/deposition process is used to form the source/drain regions 40 between the sidewall spacers 30, as provided in FIG. 9. The source/drain regions 40 are raised, and typically comprise epitaxially grown silicon or silicon germanium, for example. Confinement of lateral epitaxial growth between the sidewall spacers 30 helps to prevent a short between the semiconductor fins from N-type and P-type transistors in the boundary region between complementary devices. Also, the semiconductor fins 24 may be merged or unmerged with the source/drain regions 40, as readily appreciated by those skilled in the art.

Figure 10:
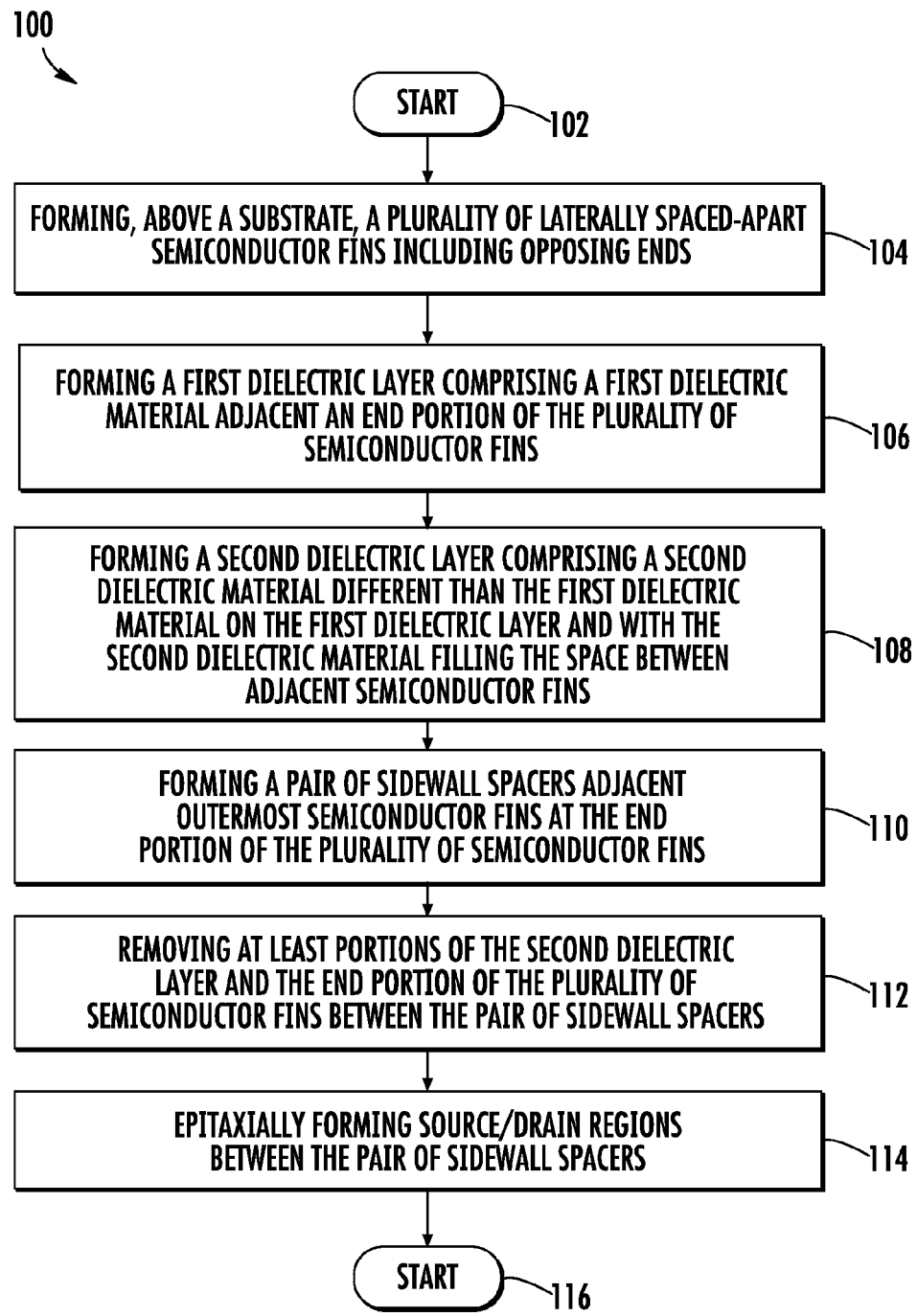
FIG. 10 is a flowchart illustrating a method of making the semiconductor FINFET device of FIG. 1.

Referring now to the flowchart 100 in FIG. 10, a method for making a semiconductor device 20 as described above will now be summarized. From the start (Block 102), the method comprises forming, above the substrate 22, a plurality of laterally spaced-apart semiconductor fins 24 at Block 104. A first dielectric layer 28 comprising a first dielectric material is formed adjacent an end portion 26 of the plurality of semiconductor fins 24 at Block 106. A second dielectric layer 34 comprising a second dielectric material different than the first dielectric material is formed at Block 108 on the first dielectric layer 28 and with the second dielectric material filling the space between adjacent semiconductor fins 24. The method further includes forming a pair of sidewall spacers 30 at Block 110 on outermost semiconductor fins at the end portion 26 of the plurality of semiconductor fins 24. At least portions of the second dielectric layer 34 and the end portion 26 of the plurality of semiconductor fins 24 are removed at Block 112 between the pair of sidewall spacers. At Block 114, source/drain regions 40 are epitaxially formed between the pair of sidewall spacers 30. The method ends at Block 116.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making a semiconductor device comprising:
   forming, above a substrate, a plurality of laterally spaced-apart semiconductor fins;
   forming at least one dielectric layer directly contacting the substrate and adjacent an end portion of the plurality of semiconductor fins and within the space between adjacent semiconductor fins;
   forming a pair of sidewall spacers adjacent outermost semiconductor fins at the end portion of the plurality of semiconductor fins;
   removing the at least one dielectric layer and end portion of the plurality of semiconductor fins between the pair of sidewall spacers; and
   forming source/drain regions between the pair of sidewall spacers.

2. The method according to claim 1 forming source/drain regions comprises epitaxially growing the source/drain regions.

3. The method according to claim 2 wherein the source/drain regions comprise silicon.

4. The method according to claim 2 wherein the source/drain regions comprise silicon germanium.

5. The method according to claim 1 wherein forming the at least one dielectric layer comprises:
   forming a first dielectric layer comprising a first dielectric material on the end portion of the plurality of semiconductor fins; and
   forming a second dielectric layer comprising a second dielectric material different than the first dielectric material on the first dielectric layer and with the second dielectric material filling the space between adjacent semiconductor fins.

6. The method according to claim 5 further comprising, before forming the sidewall spacers, removing portions of the second dielectric layer laterally adjacent the outermost semiconductor fins and above the semiconductor fins while retaining portions of the second dielectric layer filling the space between adjacent semiconductor fins.

7. The method according to claim 5 wherein forming the second dielectric layer comprises atomic layer deposition thereof.

8. The method according to claim 1 further comprising forming a gate overlying the plurality of semiconductor fins.

9. The method according to claim 1 wherein the semiconductor fins comprise silicon.

10. The method according to claim 1 wherein the substrate comprises a semiconductor substrate.

11. A method for making a semiconductor device comprising:
forming, above a substrate, a plurality of laterally spaced-apart semiconductor fins;
forming a first dielectric layer comprising a first dielectric material directly contacting the substrate and adjacent an end portion of the plurality of semiconductor fins;
forming a second dielectric layer comprising a second dielectric material different than the first dielectric material on the first dielectric layer and with the second dielectric material filling the space between adjacent semiconductor fins;
forming a pair of sidewall spacers adjacent outermost semiconductor fins at the end portion of the plurality of semiconductor fins;
removing at least portions of the second dielectric layer and the end portion of the plurality of semiconductor fins between the pair of sidewall spacers; and
epitaxially forming source/drain regions between the pair of sidewall spacers.

12. The method according to claim 11 further comprising, before forming the sidewall spacers, removing portions of the second dielectric layer laterally adjacent the outermost semiconductor fins and above the semiconductor fins while retaining portions of the second dielectric layer filling the space between adjacent semiconductor fins.

13. The method according to claim 11 wherein forming the second dielectric layer comprises atomic layer deposition thereof.

14. The method according to claim 11 further comprising forming a gate overlying the plurality of semiconductor fins.

15. The method according to claim 11 wherein the semiconductor fins and the substrate each comprises silicon.

16. A method for making a semiconductor device comprising:
forming at least one dielectric layer adjacent an end portion of a plurality of spaced apart silicon fins and within the space between adjacent silicon fins, the plurality of semiconductor fins being formed above a substrate and with the at least one dielectric layer directly contacting the substrate;
forming a pair of sidewall spacers adjacent outermost silicon fins at the end portion of the plurality of silicon fins;
removing the at least one dielectric layer and end portion of the plurality of silicon fins between the pair of sidewall spacers; and
forming source/drain regions between the pair of sidewall spacers.

17. The method according to claim 16 forming source/drain regions comprises epitaxially growing the source/drain regions.

18. The method according to claim 16 wherein forming the at least one dielectric layer comprises:
forming a first dielectric layer comprising a first dielectric material on the end portion of the plurality of silicon fins; and
forming a second dielectric layer comprising a second dielectric material different than the first dielectric material on the first dielectric layer and with the second dielectric material filling the space between adjacent silicon fins.

19. The method according to claim 18 further comprising, before forming the sidewall spacers, removing portions of the second dielectric layer laterally adjacent the outermost silicon fins and above the silicon fins while retaining portions of the second dielectric layer filling the space between adjacent silicon fins.

20. The method according to claim 18 wherein forming the second dielectric layer comprises atomic layer deposition thereof.

21. The method according to claim 16 further comprising forming a gate overlying the plurality of semiconductor fins.

* * * * *